(12) United States Patent
Dikken et al.

(10) Patent No.: US 11,765,856 B2
(45) Date of Patent: Sep. 19, 2023

(54) HOT SWAPPABLE AND EXTERNALLY ACCESSIBLE FAN TRAY AND ENCLOSURE CONFIGURED TO HOUSE THE HOT SWAPPABLE AND EXTERNALLY ACCESSIBLE FAN TRAY

(71) Applicant: Spirent Communications, Inc., San Jose, CA (US)

(72) Inventors: Frank Dikken, Thousand Oaks, CA (US); Don Chi Duong, Temple City, CA (US)

(73) Assignee: Spirent Communications, Inc., San Jose, CA (US)

( * ) Notice: Subject to any disclaimer, the term of this patent is extended or adjusted under 35 U.S.C. 154(b) by 56 days.

(21) Appl. No.: 17/465,820

(22) Filed: Sep. 2, 2021

(65) Prior Publication Data
US 2022/0141995 A1    May 5, 2022

Related U.S. Application Data

(60) Provisional application No. 63/107,402, filed on Oct. 29, 2020.

(51) Int. Cl.
*H05K 7/20* (2006.01)
(52) U.S. Cl.
CPC ..... *H05K 7/20172* (2013.01); *H05K 7/20736* (2013.01); *H05K 7/20836* (2013.01)
(58) Field of Classification Search
CPC .................................................. H05K 7/20172
See application file for complete search history.

(56) References Cited

U.S. PATENT DOCUMENTS

| | | | | |
|---|---|---|---|---|
| 6,075,698 A | * | 6/2000 | Hogan | H05K 7/20581 165/185 |
| 6,288,897 B1 | * | 9/2001 | Fritschle | H05K 7/20727 361/679.48 |
| 8,068,340 B1 | * | 11/2011 | Nguyen | F04D 25/0613 174/547 |
| 8,075,248 B2 | * | 12/2011 | Yin | H05K 7/20172 415/214.1 |

(Continued)

FOREIGN PATENT DOCUMENTS

| | | | | |
|---|---|---|---|---|
| DE | 202012005917 | * | 6/2012 | ............. F21V 33/00 |
| EP | 2751699 A1 | * | 7/2014 | ............. G06F 13/24 |

OTHER PUBLICATIONS

English translation of EP-2751699-A1.*
English translation of EP-2751699-A1 (Year: 2016).*
English translation of DE 202012005917 (Year: 2016).*

*Primary Examiner* — Mukundbhai G Patel
(74) *Attorney, Agent, or Firm* — Haynes Beffel & Wolfeld LLP; Ernest J. Beffel, Jr.; Franklin M. Schellenberg

(57) ABSTRACT

A fan tray for an enclosure containing devices to be cooled is provided. The fan tray includes a top cover having a top surface and a bottom surface facing opposite the top surface, wherein, when the fan tray is mated to the enclosure, (i) the top surface is exposed relative to outside the enclosure and (ii) the bottom surface is contained within the enclosure, a fan-receiving portion extending from the bottom surface of the top cover and configured to receive one or more fans, and one or more electrical connectors configured to provide electrical power to the one or more fans.

19 Claims, 10 Drawing Sheets

(56) References Cited

U.S. PATENT DOCUMENTS

| | | | |
|---|---|---|---|
| 2006/0218428 A1* | 9/2006 | Hurd | G06F 1/10 |
| | | | 713/500 |
| 2008/0239666 A1* | 10/2008 | Heller | H05K 7/207 |
| | | | 361/695 |
| 2017/0002835 A1* | 1/2017 | Anolik | F04D 29/601 |
| 2019/0350106 A1* | 11/2019 | Goergen | H05K 5/0226 |
| 2020/0146185 A1* | 5/2020 | Wu | H05K 7/20172 |

* cited by examiner

HOT SWAPPABLE AND EXTERNALLY ACCESSIBLE FAN TRAY AND ENCLOSURE CONFIGURED TO HOUSE THE HOT SWAPPABLE AND EXTERNALLY ACCESSIBLE FAN TRAY

CROSS-REFERENCE TO OTHER APPLICATIONS

This application claims the benefit of U.S. Provisional Patent Application No. 63/107,402, titled "HOT SWAPPABLE AND EXTERNALLY ACCESSIBLE FAN TRAY AND ENCLOSURE CONFIGURED TO HOUSE THE HOT SWAPPABLE AND EXTERNALLY ACCESSIBLE FAN TRAY," filed on 29 Oct. 2020, which application is incorporated herein by reference in its entirety.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may also correspond to implementations of the claimed technology.

Various electronic enclosures housing computing devices or various types of electronic circuitry generally require forced-air cooling fans to maintain a permissible operating temperature and to keep the devices and circuitry from overheating. Cooling fans may have a shorter operating life compared to other components, such as the devices or circuitry they are cooling, within the electronic enclosure. Accordingly, cooling fans may need to be replaced at a critical moment when downtime of the enclosed computing device(s) is inconvenient and costly.

Conventional cooling fans and fan trays of electronic enclosures are removed or replaced by removing one or more covers of the electronic enclosures. For example, a front and/or top cover of an electronic enclosure generally must be removed in order to gain access to cooling fans and/or a cooling fan tray that houses the cooling fans. This often requires a trained technician and often requires shutting down the computing device(s) inside the electronic enclosure. Furthermore, conventional cooling fans and fan trays are often accessible from the front or rear portions of the enclosure, requiring disconnection of other devices connected to the enclosure or connected within the enclosure (e.g., power cables, ethernet cables, display cables, USB devices, etc.).

Thus, a need arises for an improved cooling fan tray and fans that can be removed and replaced without removing a cover of the electronic enclosure, without shutting down one or more computing devices within the electronic enclosure, and without disconnecting other devices connected to the enclosure or within the enclosure.

SUMMARY

A simplified summary is provided herein to help enable a basic or general understanding of various aspects of exemplary, non-limiting implementations that follow in the more detailed description and the accompanying drawings. This summary is not intended, however, as an extensive or exhaustive overview. Instead, the sole purpose of the summary is to present some concepts related to some exemplary non-limiting implementations in a simplified form as a prelude to the more detailed description of the various implementations that follow.

As described herein, a fan tray for an enclosure containing devices to be cooled comprises a top cover having a top surface and a bottom surface facing opposite the top surface. When the fan tray is mated to the enclosure, the top surface is exposed relative to outside the enclosure and the bottom surface is contained within the enclosure. The fan tray also comprises a fan-receiving portion extending from the bottom surface of the top cover and configured to receive one or more fans, and one or more electrical connectors configured to provide electrical power to the one or more fans. The fan tray may comprise one or more fans. In some examples, the fan tray may further comprise one or more vertical rails that partition the fan-receiving portion into two or more regions, extend vertically from the bottom surface of the top cover, and are configured to provide support for the one or more fans. Herein, orientation descriptors "vertical" and "horizontal" are used to describe an orientation of an element in a context relative to the structure to which the element is related, and not relative to the gravitational direction. For example, the one or more vertical rails that extend vertically from the bottom surface of the top cover are substantially perpendicular to the bottom surface of the top cover.

In some implementations, these regions each need not contain a fan at all times. The fan tray may further comprise one or more horizontal rails extending horizontally along a bottom portion of the one or more fans and connected to the one or more vertical rails. The electrical connectors may extend from the one or more horizontal rails and, when the fan tray is mated to the enclosure, may be configured to connect to and receive power from a power source within the enclosure. In some implementations, the fan tray may be configured to be removed from the enclosure without removal of any other portion of the enclosure. Also, the fan tray may be configured to be removed from the enclosure without disconnecting any of the devices (to be cooled) in the enclosure. For example, such devices may be electrically connected to the enclosure (e.g., such as to power supplies mounted to the enclosure) or have various electrical connections to other devices within the enclosure. In some implementations, the electrical connectors may extend from a bottom portion of the fan-receiving portion and, when the fan tray is mated to the enclosure, may be configured to connect to and receive power from a power source within the enclosure. In other implementations, the electrical connectors may extend from the bottom surface of the top cover and, when the fan tray is mated to the enclosure, may be configured to connect to and receive power from a power source within the enclosure.

The fan tray may further comprise a first rail located at a first end of the fan tray and a second rail located at a second end of the fan tray. The first rail may be configured to be received by a first rail guide of the enclosure and the second rail may be configured to be received by a second rail guide of the enclosure. The top cover may include a first end and a second end. The first end and the second end of the top cover may extend in a downward direction and, when the fan tray is mated to the enclosure, may be configured to engage with sidewalls of the enclosure.

In some embodiments, the top surface of the top cover may include one or more handles by which a user inserts or removes the fan tray into or from the enclosure. The one or more handles may be recessed into the top cover. Each of the one or more handles may include a latching mechanism that, while engaged, locks the fan tray in a mated configuration with the enclosure and, while disengaged, allows the fan tray to be removed from the enclosure. In some embodiments, the top cover may include one or more openings and the one or more fans may be squirrel-cage fans configured to exhaust air through the one or more openings. In other embodiments, the top cover may include one or more openings and the fan tray may comprise exhaust deflectors positioned to direct exhaust from the one or more fans toward the one or more openings.

In some embodiments, the fan tray may further comprise electronic sensors to monitor temperature or flow of exhaust from the one or more fans. The electrical connectors may be configured to convey electrical signals to electronic circuitry located in the container.

In still other embodiments, an enclosure for enclosing devices to be cooled comprises a fan tray, which in turn comprises a top cover having a top surface and a bottom surface facing opposite the top surface, a fan-receiving portion extending from the bottom surface of the top cover and to receive one or more fans, and one or more electrical connectors configured to provide electrical power to the one or more fans. When the fan tray is mated to the enclosure i) the top surface is exposed relative to outside the enclosure and (ii) the bottom surface may be contained within the enclosure. The enclosure further comprises electronic circuitry configured to sense removal of the fan tray from the enclosure and to deactivate at least some of the devices after a predetermined time span for when the fan tray is removed from the enclosure. When the fan tray is mated with the enclosure, the top cover of the fan tray may be flush with a top cover of the enclosure. The fan tray may be a first fan tray and may be configured to be removed from the enclosure without powering down the devices in the enclosure. In such a case, the enclosure may be configured to receive a second fan tray as a substitute for the first fan tray.

In some embodiments, a fan tray includes a top cover having a top surface that is externally accessible from outside an enclosure, one or more fans connected to a bottom surface of the top cover, and one or more electrical connectors configured to provide electrical power to the one or more fans. A method of swapping the fan tray from the enclosure, which contains devices to be cooled, includes removing the fan tray from the enclosure without removing the cover of the enclosure by pulling the fan tray away from the enclosure, maintaining power to the devices while the fan tray is removed from the enclosure, and replacing the fan tray by inserting another fan tray into the enclosure. Maintaining power to the devices while the fan tray is removed from the enclosure may comprise measuring a time span during which the fan tray is removed from the enclosure, and maintaining power to the devices if the measured time span is less than a predetermined time span.

In some embodiments, a fan tray can be removed or replaced without the removal of a cover of an electronic enclosure, without needing to power down the computing devices located within the electronic enclosure, and without disconnecting other devices connected to the enclosure or within the enclosure.

In some embodiments, a method of removing a hot-swappable fan tray from an enclosure that houses devices to be cooled without removal of a top cover of the enclosure involves pulling the fan tray away from the enclosure without powering down the devices housed within the enclosure.

Other aspects and advantages of the technology disclosed can be seen on review of the drawings, the detailed descriptions, and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

DETAILED DESCRIPTION

Figure 1:
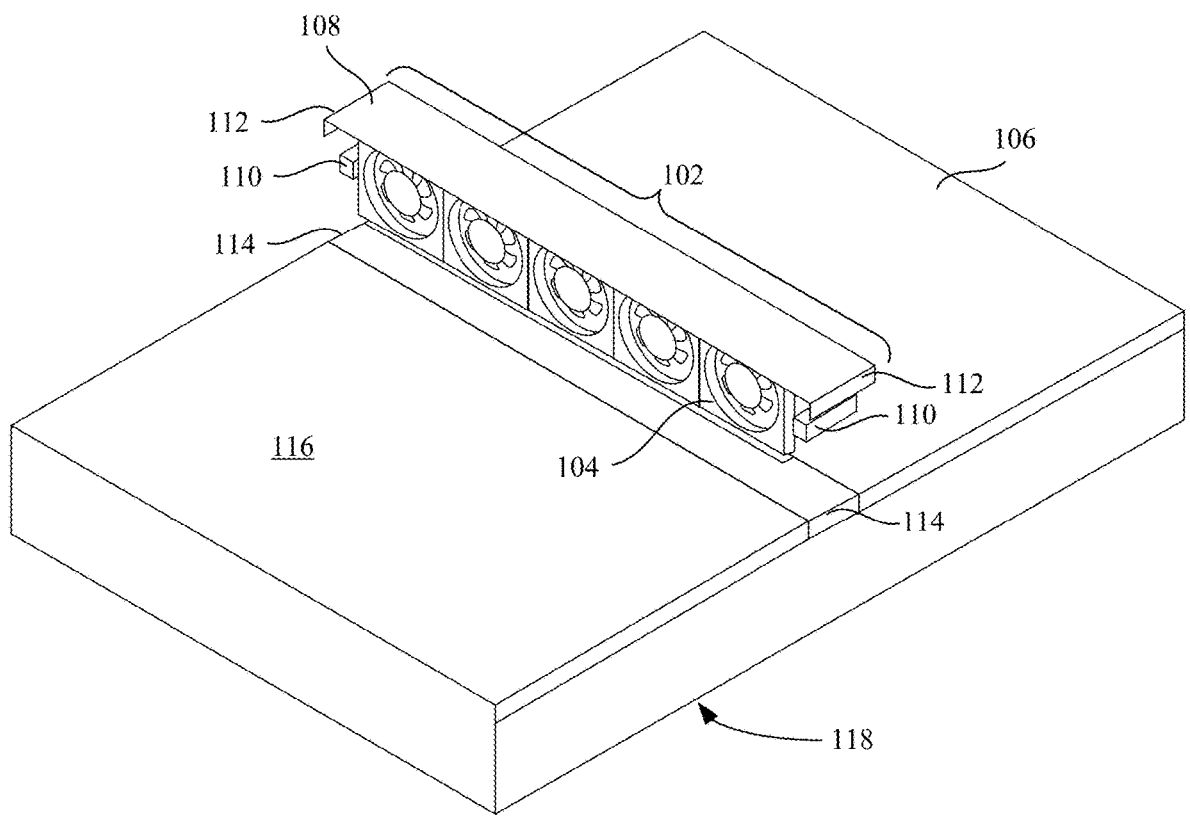
FIG. 1 illustrates a top perspective view of a hot-swappable fan tray, fans, and an enclosure, according to an embodiment.

The following detailed description is made with reference to the figures. Sample implementations are described to illustrate the technology disclosed, not to limit its scope, which is defined by the claims. Those of ordinary skill in the art will recognize a variety of equivalent variations on the description that follows.

The technology described herein provides a fan tray that allows for access of its fans located inside or outside an enclosure that contains one or more electronic devices. Such a fan tray is hereinafter equivalently called a "hot-swappable fan tray." The hot-swappable fan tray may be configured to provide service access to the fans without opening portions (e.g., a top or side cover) of the enclosure. For example, the hot-swappable fan tray can be simply removed and replaced without the need to deactivate the electronic devices inside the enclosure. In other words, the fan tray is configured to be removed from the enclosure without removal of any other portion of the enclosure or without removal of electronic devices therein. This relatively simple removal and replacement ability can allow for reduced down-time of the electronic devices within the enclosure, help avoid the need for a trained and equipped service person, and reduce maintenance expenses, just to name a few advantages. For example, cooling fans are generally associated with a higher failure rate relative to sub-assemblies and interior components of the enclosure. Accordingly, allowing for improved access and easier replacement or repair of cooling fans may provide a substantial benefit.

The hot-swappable fan tray may be configured so that electrical cables attached to other devices within the enclosure need not be disconnected during insertion or removal of the fan tray. This allows the front, rear, sides, top and bottom of the enclosure to remain free for full utilization and connection to other devices, such as connectors, displays, air vents and other modular plug-in subassemblies, for example.

The fan tray can be centrally located within the enclosure to support optimal airflow capabilities allowing for a "push/pull" airflow orientation, which can produce more efficient and quieter cooling as compared to fans located at ends of an enclosure. Such positioning and configuration, herein referred to as a mid-mount fan tray configuration, may allow for the front and rear sides of the enclosure to remain accessibly free to be utilized for purposes such as electrical connections, displays, air vents, and various modular plug-in sub-assemblies, just to name a few examples. In other words, in addition to improving airflow, a mid-mount fan tray configuration avoids having fans being in the way and preventing front and rear sides of the enclosure to be used for purposes other than cooling and ventilation of the enclosure's contents. Additionally, a mid-mount fan tray configuration may allow for more efficient electrical connections and pathways to the enclosure's contents.

Alternatively, the fan tray can be located closer to one or another end of the enclosure. This positioning and configuration can be referred to as a non-mid-mount configuration. Additionally, the fans of the fan tray can be configured as inlet "pull" fans or as exhaust "push" fans. The fans can switch between inlet "pull" fans and exhaust "push" fans by changing their orientation or by electronically changing the spinning direction of the fans.

FIG. 1 illustrates a top perspective view of a hot-swappable fan tray 102, fans 104, and a portion of an enclosure 106 (that can enclose electronic components), according to an embodiment. In detail, fan tray 102 includes a top cover 108 including top and bottom surfaces, one or more fans 104 that may be removeable or permanently affixed to fan tray 102, and one or more electrical connectors 110. When installed, fan tray 102 may be electrically connected to electrical connectors (not illustrated in FIG. 1) located in a portion of the enclosure 106. Fan tray 102 may include any number of positions for fans 104 (e.g., each position for each fan). Each such position need not contain a fan at all times. In other words, fan tray 102 may operate with less than the number of fans for which it was designed. In some embodiments, top cover 108 of fan tray 102 may be configured to physically conform to the shape and size of enclosure 106. For example, one or more corners 112 of fan tray 102 may coincide with one or more corners 114 of enclosure 106, either by physical overlapping, or by mutually fitting together, when fan tray 102 is installed in enclosure 106. Fans 104 may be attached to the bottom portion of top cover 108 and may be removed and replaced individually. In some embodiments, fan tray 102 may include a single fan, as opposed to multiple fans 104. Electrical connectors 110 may be configured to connect to and receive power from a power source within enclosure 106 and to provide electrical power to fans 104.

In other embodiments, fan tray 102 may be installed, and thus removed and replaced, via the bottom side of enclosure 106. In other words, instead of the embodiment illustrated in FIG. 1 where fan tray 102 is installed in enclosure 106 via the enclosure's topside 116, fan tray 102 may be installed in enclosure 106 via a bottom side 118 of the enclosure. In such embodiments, for example, electrical connections between a circuit board (e.g., a motherboard) in the enclosure and fan tray 102 may be on the underside of the circuit board.

Figure 2:
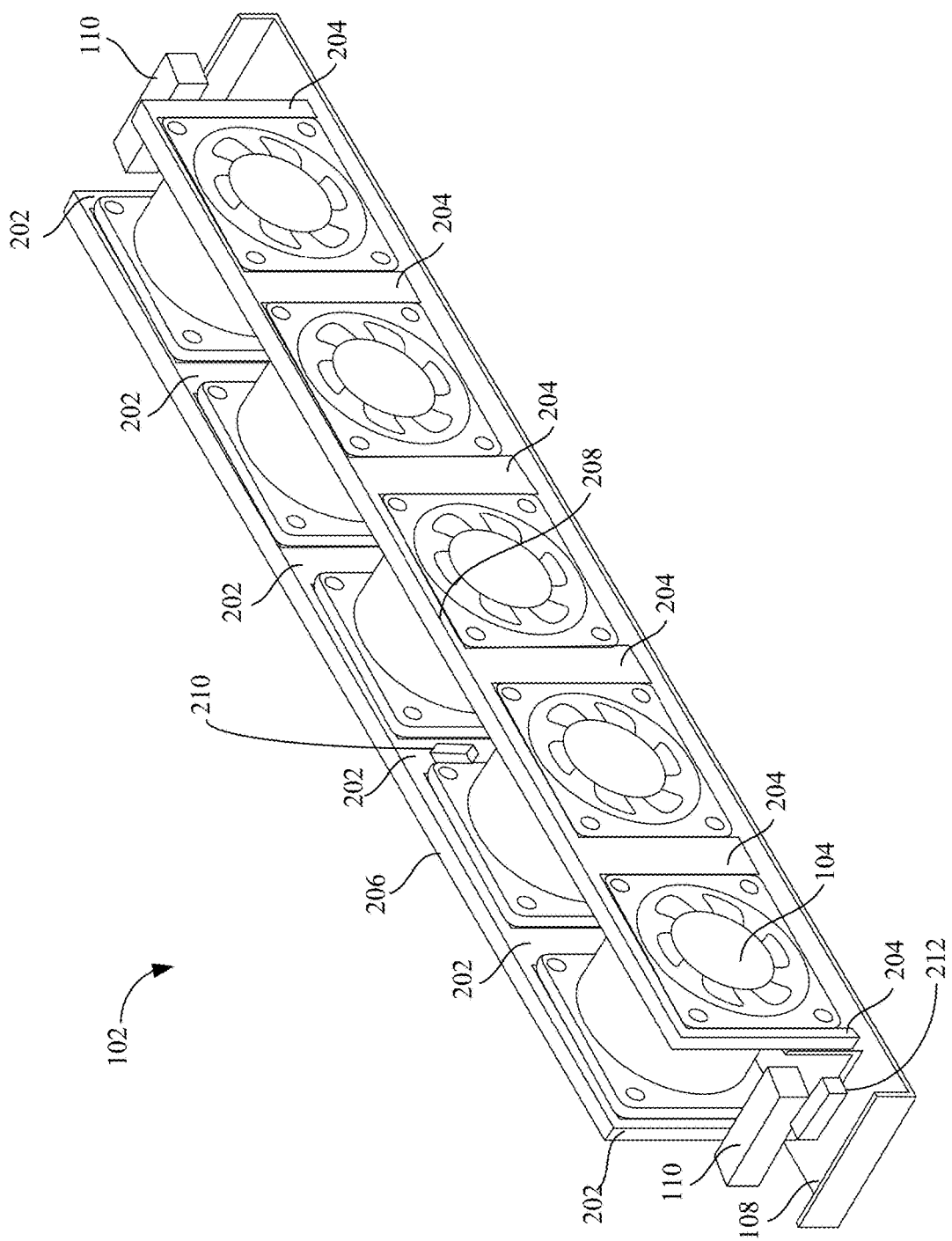
FIG. 2 illustrates a bottom perspective view of a hot-swappable fan tray and fans, according to an embodiment.

FIG. 2 illustrates a bottom perspective view of hot-swappable fan tray 102, including fans 104, according to an embodiment. Fan tray 102 also includes top cover 108 and one or more electrical connectors 110. Additionally, fan tray 102 includes a first set of vertical rails 202, a second set of vertical rails 204, a first horizontal (bottom) rail 206 and a second horizontal (bottom) rail 208. The horizontal rails may extend horizontally along a bottom portion of the fans and may connect to the vertical rails. The number of rails in the first set of vertical rails 202 and in the second set of vertical rails 204 may vary depending upon the number of fans 104 included in fan tray 102. The first set of vertical rails 202, the second set of vertical rails 204, the first horizontal rail 206, and the second horizontal rail 208 can form a fan-receiving portion that extends from the bottom surface of the top cover 108. Such vertical rails (i) at least partially partition fan-receiving portions of the fan tray into two or more regions, (ii) extend vertically from the bottom surface of top cover 108, and (iii) are configured to provide physical support for the fans. Rails 202, 204, 206, and 208 may be of a unibody construction, individual components, or a combination of the two types of configurations. First and second sets of vertical rails 202, 204 may be attached to a bottom portion of top cover 108 of fan tray 102. Rails 202, 204, 206, and 208 may provide a fastening structure to which fans 104 can be attached. Rails 202, 204, 206, and 208 may also provide a fastening structure to which the one or more electrical connectors 110 can be attached. The one or more electrical connectors 110 may provide electrical power to fans 104 using electrical wires (not illustrated). In some implementations, the one or more electrical connectors 110 may extend from the horizontal rails 206, 208 and, when the fan tray 102 is mated to the enclosure 106, may be configured to connect to and receive power from a power source within the enclosure 106. In other implementations, the one or more electrical connectors 110 may extend from bottom portions of the fans 104 and, when the fan tray 102 is mated to the enclosure 106, may be configured to connect to and receive power from a power source within the enclosure 106. In other implementations, the one or more electrical connectors 110 may extend from a bottom surface of the top cover 108 and, when the fan tray 102 is mated to the enclosure 106, may be configured to connect to and receive power from a power source within the enclosure 106.

In some embodiments, fan tray 102 may include one or more electronic sensors 210 to monitor temperature within the enclosure 106 or flow of exhaust from fans 104. In such embodiments, the one or more electrical connectors 110 may be further configured to convey electrical signals from the electronic sensors 210 to electronic circuitry located in enclosure 106. For example, enclosure 106 may include electronics and/or a processor that receives the electrical signals from the electronic sensors 210 and determines, based on the electrical signals, whether to change the speed of the fans 104 (e.g., speed up fans in the presence of excessive heat or slow down the fans if temperature is sufficiently cool) or whether to shut off devices within the enclosure (e.g., in case of an over-heating event).

In some embodiments, fan tray 102 may include a processor 212 (e.g., and memory containing programming logic) configured to deactivate at least some of the devices in the enclosure 106 when the fan tray 102 is removed from the enclosure for a predetermined time span. In other embodiments, such a processor may be located instead in the enclosure 106. Processor 212 may determine whether to turn off components in the enclosure to prevent overheating if the fan tray is removed for a predetermined time. For example, disconnection and removal of the fan tray 102 from the enclosure 106 may initiate a timer to measure the duration for which the fan tray 102 is removed from the enclosure 106. If the duration exceeds the predetermined time, processor 212 may turn off one or more components in the enclosure 106. In some implementations, processor 212 may communicate continuously or from time to time with another processor (or other electronics) in the enclosure while fan tray 102 is in the enclosure. Such communication, which may be stored in a memory that is also located in the enclosure, may include time span instructions about when to deactivate individual or all components in the enclosure. Removal (and insertion) of fan tray 212 may be detected by one or more sensors (e.g., optically or via contact switch). Thus, upon or after fan tray 102 is removed, detection of such removal may initiate the processor of the enclosure to begin measuring the time that fan tray 212 is removed from the enclosure. In this way, the processor of the enclosure may determine, based in part on previously received instructions from processor 212, when to turn off components in the enclosure to prevent overheating if the fan tray is removed for a predetermined time.

In some embodiments, fans 104 may be physically and electrically attached to fan tray 102 via plugs. For example, each fan 104 may have a plug (male or female) that mates with a plug (female or male) attached to fan tray 102. Such a configuration may provide attachment of the fan(s) to the fan tray 102 without the use of rails, for example.

The structure of fan tray 102 may allow for relatively quick and easy removal of an entire set of fans (e.g., 104) from an enclosure (e.g., 106) without requiring the removal of any other cover(s) of the enclosure and while allowing components and devices within the enclosure to continue to operate without power interruption. Thus, for example, a worn-out or otherwise inoperable fan 104 can be replaced by removing fan tray 102 from the enclosure 106, replacing the inoperable fan 104 with an operable fan 104, and re-inserting fan tray 102 back into the enclosure 106. Alternatively, the entire fan tray 102 can be removed from the enclosure 106 and replaced by another fan tray 102, so as to reduce the time that the components and devices within the enclosure 106 continue to operate without the fans 104 running.

Figure 3:
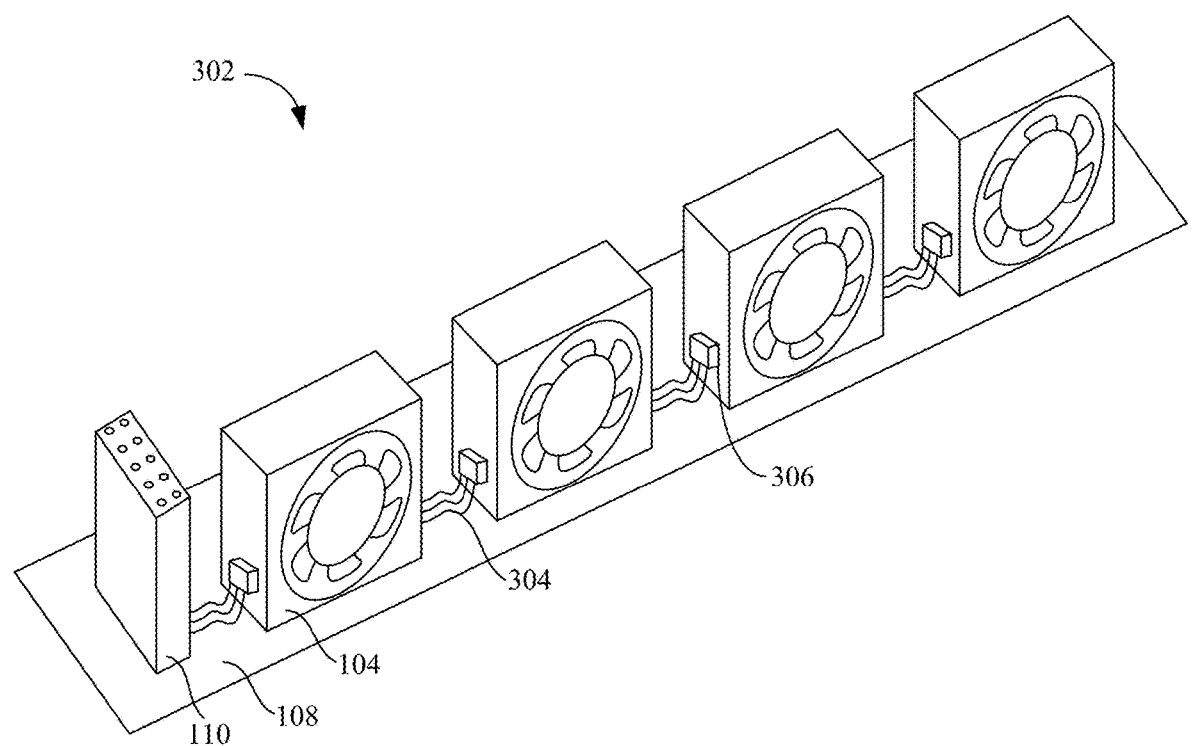
FIG. 3 illustrates a bottom perspective view of a portion of a hot-swappable fan tray that includes fans and an electrical connector, according to an embodiment.

FIG. 3 illustrates a bottom perspective view of a portion 302 of hot-swappable fan tray (e.g., 102) that includes fans 104 and the one or more electrical connectors 110, which may be a physical connector, an electrical connector, or both, according to an embodiment. Specifically, portion 302 includes single connector 110 located at or near an end of the bottom portion of top cover 108 of the fan tray. The single connector may instead be located between or among any of fans 104. Further, as illustrated, wires 304 may provide electrical power to each of fans 104. In some implementations, wires 304 may connect with individual fans 104 via a plug or connector 306. The fans 104 can be electrically connected to the one or more electrical connectors 110 in serial form or in parallel form.

Figure 4:
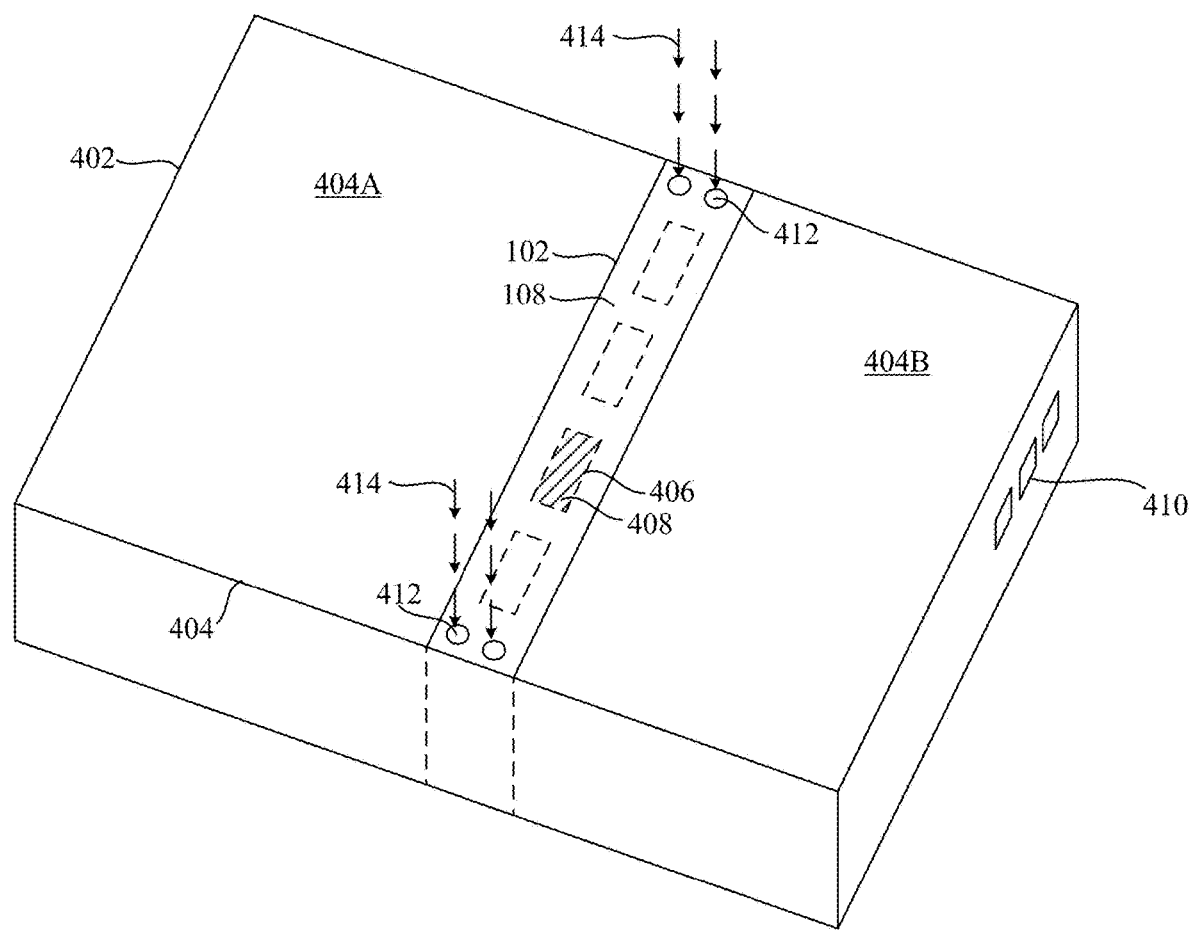
FIG. 4 illustrates a top perspective view of a hot-swappable fan tray that is inserted into an enclosure, according to an embodiment.

FIG. 4 illustrates a top perspective view of hot-swappable fan tray 102 that is inserted into an enclosure 402, according to an embodiment. Enclosure 402 may be the same or similar to enclosure 106, for example. A top side of top cover 108 of fan tray 102 may generally lie in the same plane as that of the top cover 404 of enclosure 402. Thus, the top side of top cover 108 essentially forms part of the entire top cover 404 of enclosure 402. For example, top cover 404 of enclosure 402 includes a first portion 404A and a second portion 404B that, in conjunction with top cover 108 of fan tray 102, form the top surface/cover of enclosure 402. The top portion of top cover 108 of fan tray 102, as illustrated, is essentially flush with first portion 404A and second portion 404B that form the top portion of the enclosure 400. First portion 404A, second portion 404B, and the top surface of top cover 108 may form a substantially continuous top cover surface of enclosure 402 that can eliminate the entrance of any outside debris into the inside of the enclosure 402, for example.

Dashed rectangles 406 indicate example locations of fans 104 below top cover 108. In some embodiments, top cover 108 may comprise a material (or color) that is the same as, or similar to, the material (or color) of the first and second portions 404A, 404B. In other embodiments, top cover 108 may comprise a material (or color) that is different from the material (or color) of the first and second portions 404A, 404B so that the fan tray 100 can be easily identified, for example.

In some embodiments, vent openings 408 may be located substantially above fans 104, in portions of top cover 108 illustrated by dashed rectangles 406. Such vent openings 408 may be used if fans 104 comprise squirrel-cage fans, or regular fans with an exhaust deflector, such that exhaust of the fans is directed upward through the vent openings in top cover 108. Additionally, vent openings 410 may be located in other portions (e.g., front, back, top, bottom, sides, etc.) of enclosure 402 so that fans 104 can circulate air into and out of the enclosure 402.

Access to and removal of fan tray 102 can be achieved without removing any other portion of enclosure 402 (e.g., rear and front panels and well as top and bottom covers of enclosure 402 may all remain in place while fan tray 102 is inserted into or removed from the enclosure). As described below, fan tray 102 may include handles or other grabbable element or configuration to allow for removal and insertion of fan tray 102.

In various implementations, top cover 108 may include receptacles 412 for receiving screws or the like for securing fan tray 102 to enclosure 402. Arrows 414 indicate application of screws, for example. FIG. 4 illustrates four receptacles 412 for receiving four screws. However, any number of receptacles 412 and screws can be used. FIG. 4 illustrates the mid-mount configuration (as mentioned above) with the fan tray being centrally located between the front and rear of enclosure 402. Alternatively, the fan tray may be located at or near the front and/or rear of the enclosure.

Figure 5:
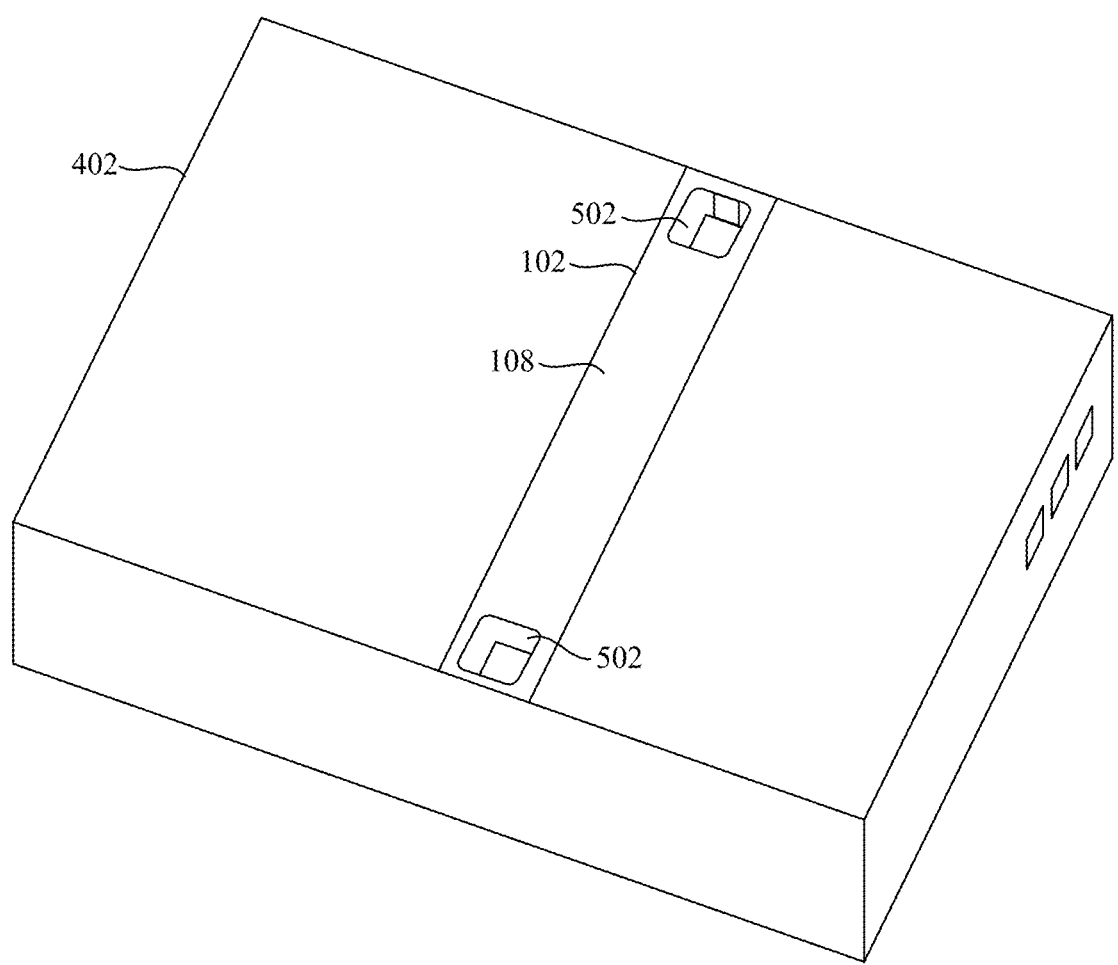
FIG. 5 illustrates a top perspective view of a hot-swappable fan tray that includes recessed latches and is inserted into an enclosure, according to an embodiment.

FIG. 5 illustrates a top perspective view of a hot-swappable fan tray that includes recessed latches and is inserted into an enclosure, according to an embodiment. FIG. 5 is similar to FIG. 4 with the addition of handles 502 that are provided on the top cover 108 of fan tray 102. Handles 502 allow a user to grab the fan tray for quick and easy removal from the enclosure 402. Handles 502 may be recessed within top cover 108 or they may extend upwardly from the top cover 108 with or without a recess. Handles 502 that extend upwardly from top cover 108 may fold over into a recess while not in use. A latching mechanism may be implemented to lock fan tray 102 in place when it is inserted into enclosure 402. In the case of recessed handles, a button or lever may be placed in the recess to allow a user to unlock the fan tray 102 using the user's fingers. If handles 502 are of the type that extend upwardly from top cover 108, the latching mechanism may be unlocked by either twisting or folding the handles out of their respective recesses to locations outside the recesses. Handles 502 may also provide a visible and convenient location for product branding or marking features for the overall product, by use of colors, embossing, or labelling, for example.

Figure 6:
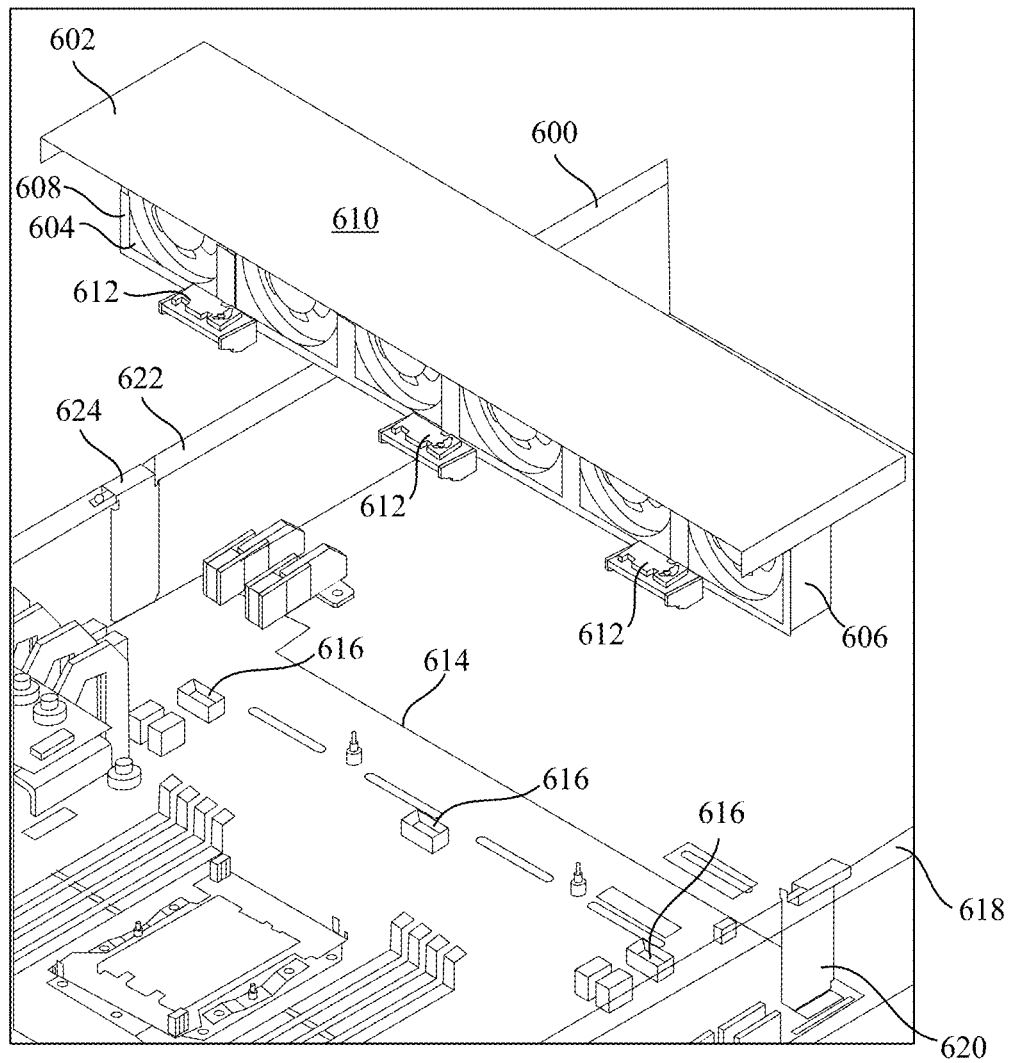
FIG. 6 illustrates a top perspective view of a hot-swappable fan tray that includes fans and rails prior to insertion into an enclosure having guides configured to receive the rails, according to an embodiment.

FIG. 6 illustrates a top perspective view of an enclosure 600 and a hot-swappable fan tray 602, which includes fans 604 and rails 606 and 608. Prior to insertion into the enclosure 600, guides of the enclosure 600 are configured to receive the rails 606, 608, according to an embodiment. Fan tray 602, like 102, includes a top cover 610, fans 604, and also includes connectors 612 that are connected to or near the bottom of fan tray 602. Alternatively, connectors 612 may be connected to bottom portions of fans 604 or any other location on fan tray 602. A chassis 614 (e.g., an electronic circuit motherboard or framework portion of an enclosure) may include connectors 616 configured to respectively receive connectors 612 when fan tray 602 is inserted into enclosure 600. Chassis 614 may also include various electronic elements such as heat sinks, one or more power supplies, electronic components (e.g., computer hardware, memory devices, etc.), connector slots, plugs, and cables, just to name a few examples, some of which are illustrated by various shapes and figures in FIG. 6. Connectors 616 provide electrical power from a power source in the enclosure 600 to connectors 612 for operating fans 604. Compared to that illustrated, there may be fewer or more connectors 612, 616, the number of which may depend on the number of fans 604. The enclosure may also include a first sidewall 618, a first rail guide 620 connected to first side wall 618, a second sidewall 622, and a second rail guide 624 connected to second sidewall 622.

As illustrated, a first rail 606 is located at or near one end of fan tray 602 and a second rail 608 is located at or near the other end. First and second rails 606, 608 may be part of a structure than holds fans 604 in place on fan tray 602 or first and second rails 606, 608 may be sidewalls of the fans themselves. When fan tray 602 is inserted into the enclosure, first rail guide 620 receives first rail 606 and second rail guide 624 receives second rail 608. First and second rail guides 620, 624 guide fan tray 602 into the correct position so as to align the respective connectors 612 of fan tray 602 with respective connectors 616 that provide electrical power. First rail 606, first rail guide 620, second rail 608, and second rail guide 624 may have a structure that prevents the first rail from being inserted into the second rail guide and that prevents the second rail from being inserted into the first rail guide. Further, the first and second rails and the first and second rail guides may be configured to prevent substantial lateral movement of fan tray 602 during insertion and removal of the fan tray and may be configured to include divots and bumps to control safe and even vertical movement of the fan tray during insertion and removal of the fan tray.

In some embodiments, first and second rail guides 620, 624 may provide a channel or chase (e.g., a throughway) between the rail guides themselves and their respective first and second sidewalls 618, 622. This channel may be used to maintain various wires/cables within enclosure 600 and away from the fans and other devices within the enclosure and to provide a clear path for the wires/cables to travel from one end of the enclosure to another end of the enclosure.

Figure 7:
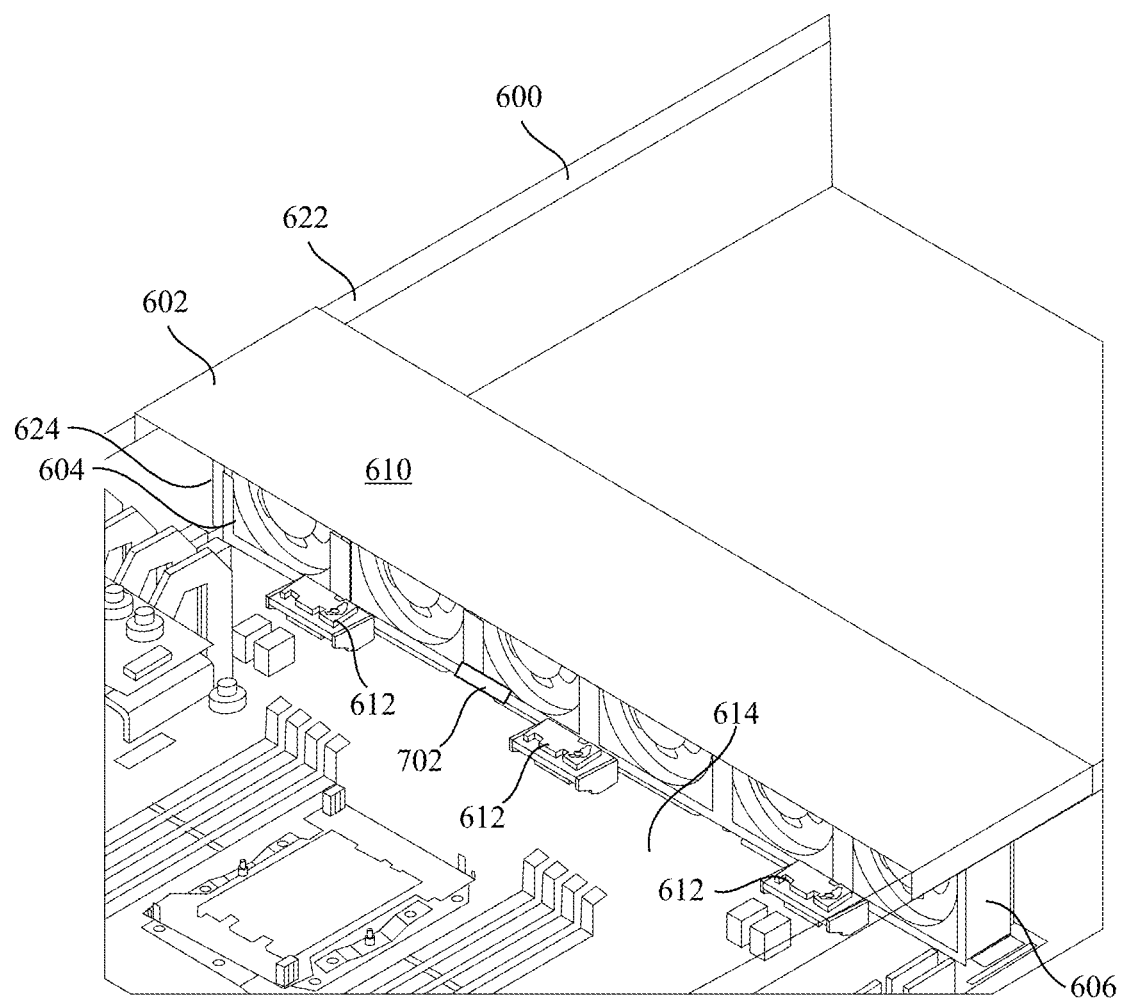
FIG. 7 illustrates a top perspective view of a hot-swappable fan tray that includes fans and rails and is inserted into an enclosure with guides configured to receive the rails, according to an embodiment.

FIG. 7 illustrates a top perspective view of fan tray 602 that is inserted into enclosure 600, according to an embodiment. FIG. 7 is similar to FIG. 6 except that FIG. 7 illustrates fan tray 602 after it is inserted into the enclosure. First rail guide 620 (not illustrated) and second rail guide 624 provide a channel for various wires and cables to travel from one end of enclosure 600 to another end of the enclosure. Guiding the wires and cables in a channel reduces risk of inadvertent contact between the removeable fan tray and the various wires and cables. For example, the channel that is formed by the first rail guide 620 prevents the various wires and cables from obstructing the fan tray 602 while it is being inserted into the enclosure 600. Similarly, the second rail guide 624 and the second sidewall 622 form a channel therebetween, so that cables and wires on the opposing side of the enclosure can travel from one end of the enclosure to another end of the enclosure.

Additionally, use of the first and second rail guides 620, 624 for the function of wire/cable channel guides may also allow for increasing airflow clearance within the overall enclosure by reducing airflow blockages by cables, wires, and connectors. This reduces the overall enclosure airflow back-pressure (e.g., "static pressure"), leading to increased cooling airflow as well as supporting lower fan speeds to reduce audible noise, increase fan life expectancy, and to lower fan failure rate (e.g., increased mean time before failure), for example.

Additionally, the enclosure 600 and/or fan tray 602 may include circuitry and/or programming logic (e.g., fan control operating circuitry) that (i) allows the components and devices within the enclosure 600 to continue to operate while the fan tray 602 is removed (e.g., removal logic) and (ii) alerts a user when a fan is beginning to fail or has failed (e.g., failure logic). Further, the circuitry and/or programming logic may include a timing mechanism and may shut down the components and devices within the enclosure 600 if the fan tray 602 is removed and a replacement fan tray has not been inserted after a predetermined amount of time (e.g., insert logic). In some embodiments, fan control operating circuitry 702 (e.g., instead of, or in addition to, the removal logic, the failure logic, and the insert logic) may be integrated into a small circuit board or module within the removable fan tray 602 or elsewhere in the enclosure 600, further supporting hot-swap maintenance features. This configuration can remove the burden of needing to implement the fan control operating circuitry in the enclosure 600.

Figure 8:
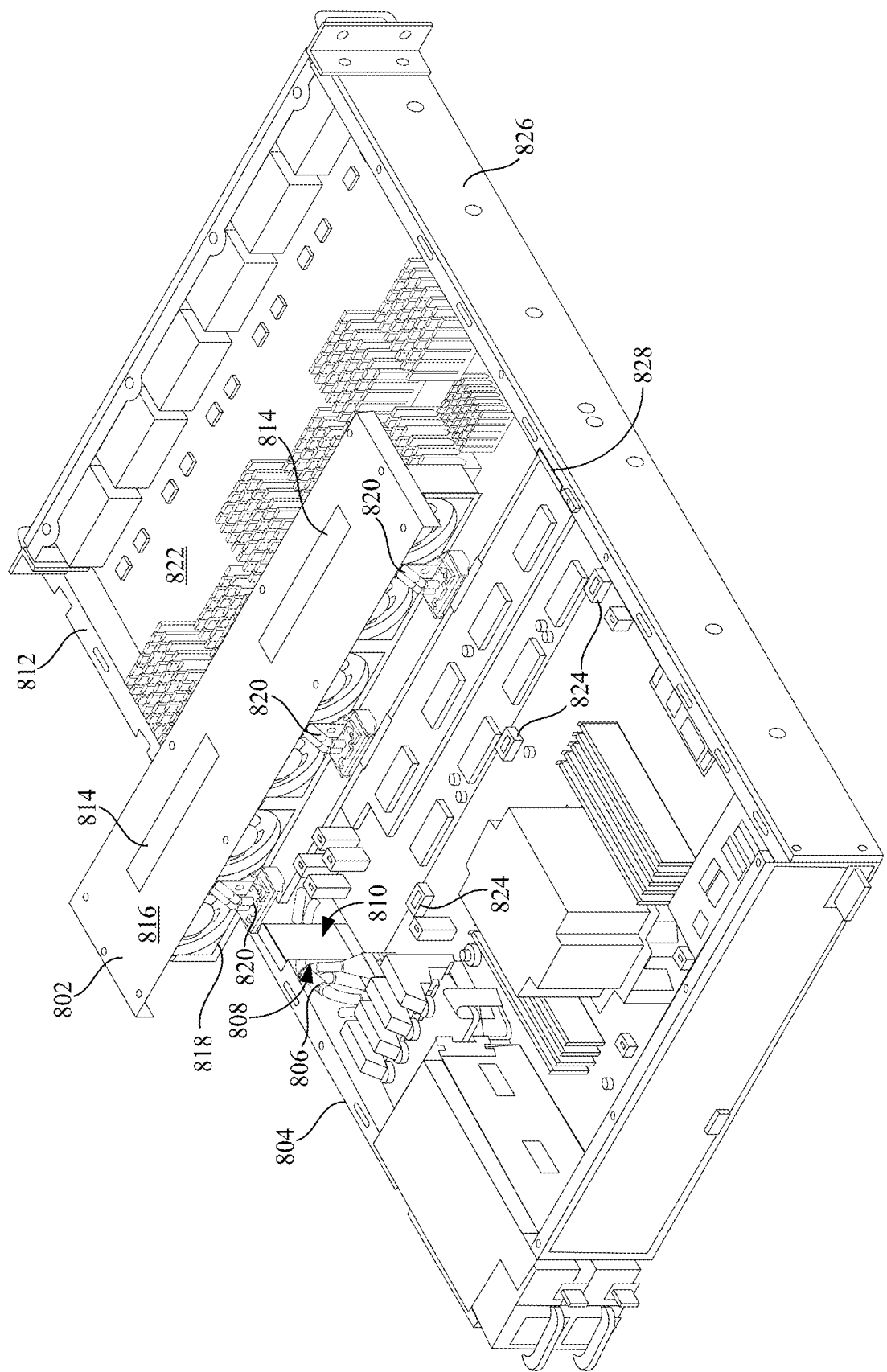
FIG. 8 illustrates a top perspective view of a hot-swappable fan tray and enclosure prior to insertion of the hot-swappable fan tray into the enclosure, according to an embodiment.

FIG. 8 illustrates a top perspective view of a hot-swappable fan tray 802 and enclosure 804 prior to insertion of the hot-swappable fan tray into the enclosure, according to an embodiment. Enclosure 804 is similar to enclosure 600 except that enclosure 804 includes cables/wires 806 directed into a channel 808 formed between a rail guide 810 and sidewall 812. Cables/wires 806 may extend through channel 808 and thus may be kept out of the way of various components within enclosure 804 and out of the way of fan tray 802. Fan tray 804 is similar to fan tray 602 except that fan tray 804 includes one or more handles 814 attached to the top side of a top cover 816 of the fan tray 802. The one or more handles 814 may be recessed and/or hinged or may be able to pop up and/or lever up for insertion or extraction of the fan tray 802. In other embodiments, the one or more handles 814 may be attached to the top side of top cover 816 in a non-recessed manner or in any other way described in this document.

Fan tray 802, like 602, includes fans 818 and connectors 820 that are connected to or near the bottom of fan tray 802. A chassis 822 (e.g., an electronic circuit motherboard or framework portion of an enclosure) may include connectors 824 configured to respectively receive connectors 820 when fan tray 802 is inserted into enclosure 804. Chassis 822 may also include various electronic elements such as heat sinks, one or more power supplies, electronic components (e.g., computer hardware, memory devices, etc.), connector slots, plugs, and cables, just to name a few examples, some of which are illustrated by various shapes and figures in FIG. 8. Connectors 824 may provide electrical power from a power source in the enclosure to connectors 820 for operating fans 818. Compared to that illustrated, there may be fewer or more connectors 820, 824, the number of which may depend on the number of fans 818. The enclosure may also include a sidewall 826 and a rail guide 828 connected to side wall 826. Rail guide 828 may operate in conjunction with rail guide 810 to guide fan tray 802 during insertion and removal processes. For example, the structure of rail guides 810, 828 and sidewalls 812, 826 may allow for blind-mate guidance for installing and removing fan tray 802 and the forming of the channels (e.g., 808) for the cables/wires 806.

Figure 9:
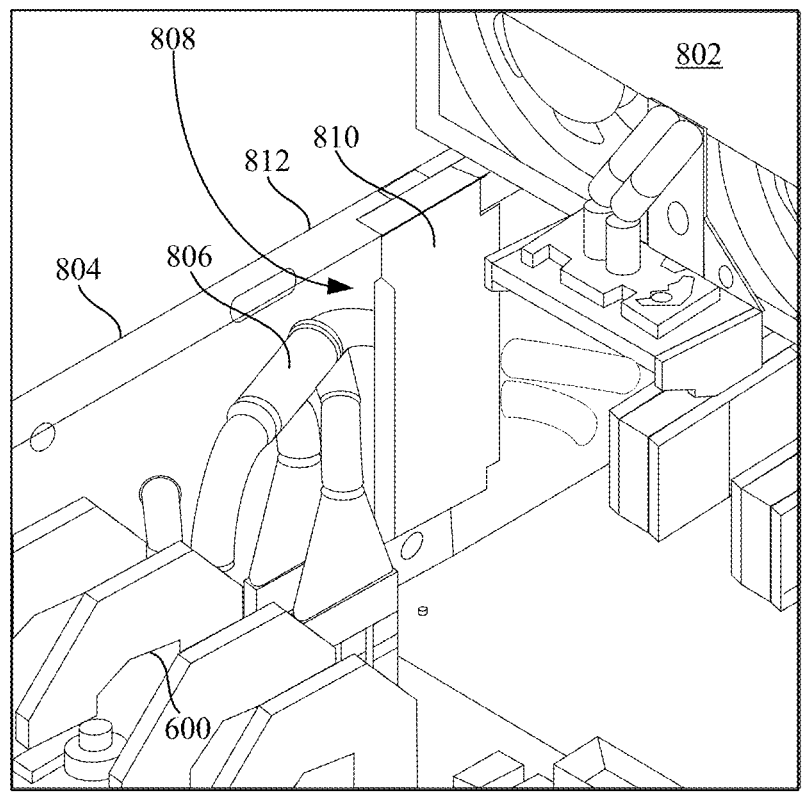
FIG. 9 illustrates a top perspective close-up view illustrating wires that are secured between a rail guide and a sidewall of an enclosure, according to an embodiment.

FIG. 9 illustrates a top perspective close-up view illustrating cables/wires 806 that are secured between rail guide 810 and sidewall 812 of enclosure 804, according to an embodiment. Cables/wires 806 are directed into channel 808 formed between rail guide 810 and sidewall 812. As mentioned above, cables/wires 806 may extend through channel 808 and thus may be kept out of the way of various components within enclosure 804 and out of the way of fan tray 802. Channel 808 allows cables/wires 806 to reach both sides of enclosure 804 even when fan tray 802 is inserted into the enclosure.

Figure 10:
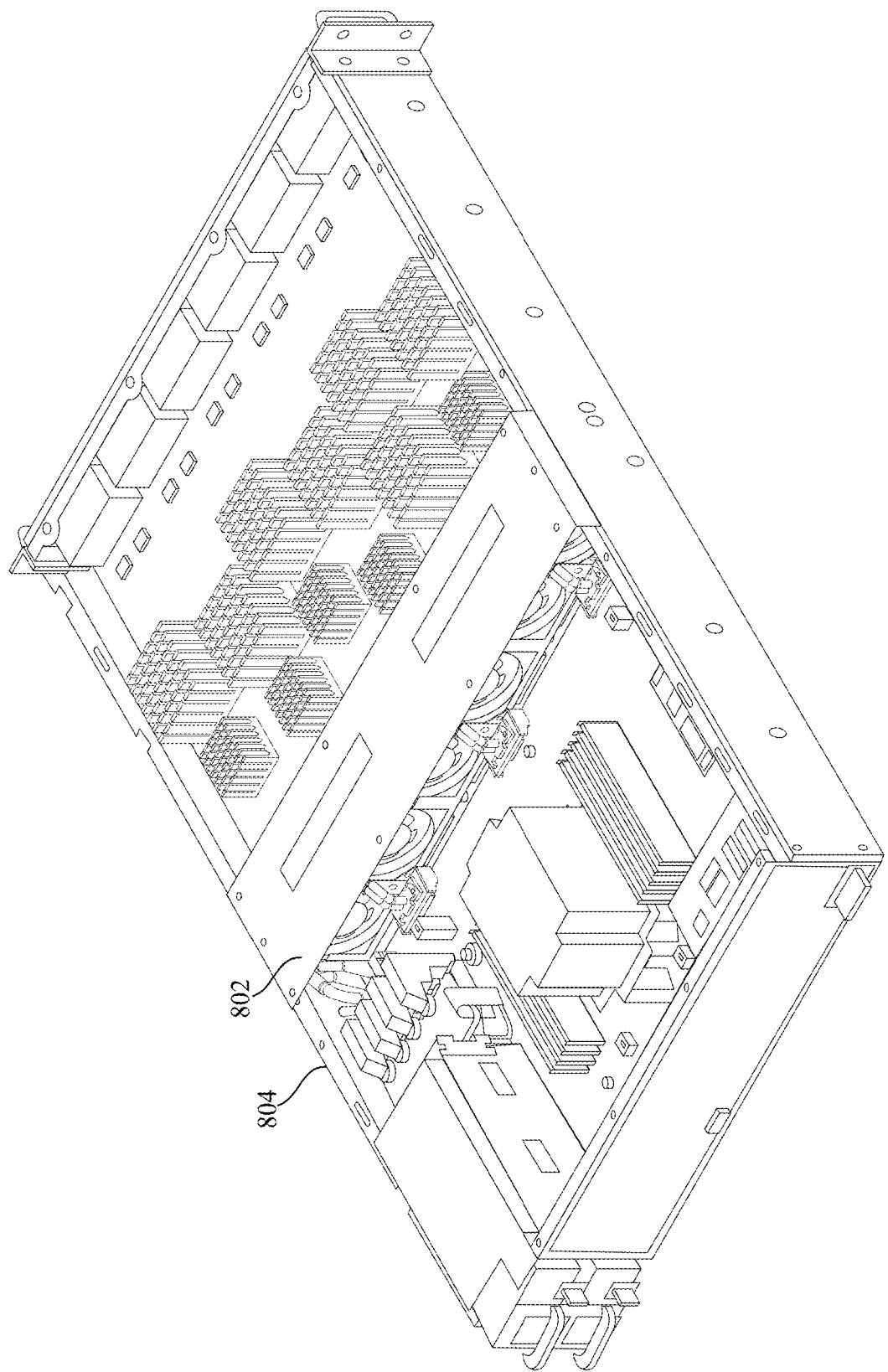
FIG. 10 illustrates a top perspective view of a hot-swappable fan tray that is inserted into the enclosure, according to an embodiment.

FIG. 10 illustrates a top perspective view of fan tray 802 that is inserted into enclosure 804, according to an embodiment. FIG. 10 is similar to FIG. 8 except that FIG. 10 illustrates fan tray 802 after it has been inserted into enclosure 804.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

We claim:

1. A fan tray for an enclosure containing devices to be cooled, the fan tray comprising:
 a top cover having a top surface and a bottom surface facing opposite the top surface, wherein, when the fan tray is mated to the enclosure, (i) the top surface is exposed relative to outside the enclosure and (ii) the bottom surface is contained within the enclosure;
 a fan-receiving portion extending from the bottom surface of the top cover and configured with structures for receiving one or more fans, and additionally configured so that, when the fan tray is mated to the enclosure, the fan-receiving portion is entirely covered by the top cover;
 a first tray rail located at a first end of the fan tray and a second tray rail located at a second end of the fan tray, wherein the first tray rail is configured to be received by a first rail guide of the enclosure and the second tray rail is configured to be received by a second rail guide of the enclosure; and
 one or more electrical connectors configured to provide electrical power to the one or more fans.

2. The fan tray of claim 1, further comprising one or more fans.

3. The fan tray of claim 2, wherein the structures for receiving one or more fans comprise:
 one or more vertical rails that
  at least partially partition the fan-receiving portion into two or more regions,
  extend vertically from the bottom surface of the top cover, and
  are configured to provide support for the one or more fans; and
 one or more horizontal rails extending horizontally along a bottom portion of the one or more fans and connected to the one or more vertical rails.

4. The fan tray of claim 3, wherein
 the one or more electrical connectors extend from the one or more horizontal rails and, when the fan tray is mated to the enclosure, the one or more electrical connectors are configured to connect to and receive power from a power source within the enclosure.

5. The fan tray of claim 2, wherein
 the one or more electrical connectors extend from a bottom portion of the fan-receiving portion and, when the fan tray is mated to the enclosure, the one or more electrical connectors are configured to connect to and receive power from a power source within the enclosure.

6. The fan tray of claim 2, wherein
 the fan tray is configured to be removed from the enclosure without disconnecting any of the devices to be cooled that have connections within the enclosure or that are connected to the enclosure.

7. The fan tray of claim 2, further comprising:
 electronic sensors to monitor temperature within the enclosure or flow of exhaust from the one or more fans, wherein the electrical connectors are further configured to convey electrical signals from the electronic sensors to electronic circuitry located in the enclosure.

8. The fan tray of claim 2, further comprising:
 circuitry or memory containing programming logic configured to deactivate at least some of the devices of the enclosure when the fan tray is removed from the enclosure for a predetermined time span.

9. The fan tray of claim 1, wherein
 the electrical connectors extend from the bottom surface of the top cover and, when the fan tray is mated to the enclosure, are configured to connect to and receive power from a power source within the enclosure.

10. The fan tray of claim 1, wherein
 the top cover includes a first end and a second end, and wherein the first end and the second end of the top cover extend in a downward direction and, when the fan tray is mated to the enclosure, the first end and the second end are configured to engage with sidewalls of the enclosure.

11. The fan tray of claim 1, wherein
 the top surface of the top cover includes one or more handles by which a user inserts the fan tray into, or removes the fan tray from, the enclosure.

12. The fan tray of claim 11, wherein
 the one or more handles are recessed into the top cover.

13. The fan tray of claim 11, wherein
each of the one or more handles includes a latching mechanism that, while engaged, locks the fan tray in a mated configuration with the enclosure and, while disengaged, allows the fan tray to be removed from the enclosure.

14. The fan tray of claim 1, wherein
the fan tray is configured to be removed from the enclosure without removal of any other portion of the enclosure.

15. An enclosure for enclosing devices to be cooled, the enclosure comprising:
a first rail guide and a second rail guide;
a fan tray comprising:
a top cover having a top surface and a bottom surface facing opposite the top surface, wherein, when the fan tray is mated to the enclosure, (i) the top surface is exposed relative to outside the enclosure and (ii) the bottom surface is contained within the enclosure;
a fan-receiving portion extending from the bottom surface of the top cover and configured with rails for receiving one or more fans, and additionally configured so that, when the fan tray is mated to the enclosure, the fan-receiving portion is entirely covered by the top cover;
a first tray rail located at a first end of the fan tray and a second tray rail located at a second end of the fan tray, wherein the first tray rail is configured to be received by the first rail guide of the enclosure and the second tray rail is configured to be received by the second rail guide of the enclosure; and
one or more electrical connectors configured to provide electrical power to the one or more fans; and
electronic circuitry configured to sense removal of the fan tray from the enclosure and to deactivate at least some of the devices after a predetermined time span from when the fan tray is removed from the enclosure.

16. The enclosure of claim 15, wherein, when the fan tray is mated with the enclosure,
the top cover of the fan tray is flush with a top cover of the enclosure.

17. The enclosure of claim 15, wherein
the fan tray is a first fan tray and is configured to be removed from the enclosure without powering down the devices in the enclosure, and wherein
the enclosure is configured to receive a second fan tray as a substitute for the first fan tray.

18. A method of swapping a fan tray from an enclosure that contains devices to be cooled, wherein the fan tray includes:
a top cover having a top surface that is externally accessible from outside the enclosure;
one or more fan-receiving portions connected to a bottom surface of the top cover, wherein the fan-receiving portions comprising comprise support rails to support fans, and wherein the fan receiving portion is configured so that, when the fan tray is mated to the enclosure, the fan-receiving portion is entirely covered by the top cover;
one or more fans;
a first tray rail located at a first end of the fan tray and a second tray rail located at a second end of the fan tray, wherein the first tray rail is configured to be received by a first rail guide of the enclosure and the second tray rail is configured to be received by a second rail guide of the enclosure; and
one or more electrical connectors configured to provide electrical power to the one or more fans, and
wherein the method includes:
removing the fan tray from the enclosure by pulling the fan tray away from the enclosure; and
maintaining power to at least some of the devices while the fan tray is removed from the enclosure; and
replacing the fan tray by inserting another fan tray into the enclosure.

19. The method of claim 18, wherein
the maintaining of the power to the at least some of the devices while the fan tray is removed from the enclosure comprises:
measuring a time span during which the fan tray is removed from the enclosure; and
maintaining power to the at least some of the devices when the measured time span is less than a predetermined time span.

* * * * *